(12) United States Patent
Park et al.

(10) Patent No.: US 7,545,423 B2
(45) Date of Patent: Jun. 9, 2009

(54) IMAGE SENSOR HAVING A PASSIVATION LAYER EXPOSING AT LEAST A MAIN PIXEL ARRAY REGION AND METHODS OF FABRICATING THE SAME

(75) Inventors: Young Hoon Park, Yongin (KR); Ki Hong Kim, Yongin (KR); Bum Suk Kim, Yongin (KR); Jeong Hoon Bae, Yongin (KR); Yu Jin Ahn, Seoul (KR); Jung Chak Ahn, Suwon (KR); Soo Cheol Lee, Seoul (KR); Yong Jei Lee, Yongin (KR); Sung In Hwang, Yongin (KR)

(73) Assignee: Samsung Electronics Co., Ltd. (KR)

( * ) Notice: Subject to any disclaimer, the term of this patent is extended or adjusted under 35 U.S.C. 154(b) by 626 days.

(21) Appl. No.: 11/044,135

(22) Filed: Jan. 27, 2005

(65) Prior Publication Data
US 2006/0011813 A1    Jan. 19, 2006

(30) Foreign Application Priority Data
Jul. 16, 2004    (KR)    ........................ 10-2004-0055760

(51) Int. Cl.
H04N 5/335    (2006.01)
H04N 3/14    (2006.01)

(52) U.S. Cl. ........................ 348/294; 348/308; 257/290; 257/293

(58) Field of Classification Search ................. 257/231, 257/233, 291, 294; 348/294, 302–310; 297/290, 297/291–294
See application file for complete search history.

(56) References Cited

U.S. PATENT DOCUMENTS

| | | | |
|---|---|---|---|
| 3,787,962 A | 1/1974 | Yoshida et al. | |
| 5,233,181 A * | 8/1993 | Kwansnick et al. | 250/208.1 |
| 5,668,397 A | 9/1997 | Davis et al. | |
| 6,023,081 A | 2/2000 | Drowley et al. | 257/292 |
| 6,060,732 A * | 5/2000 | Murakami et al. | 257/215 |
| 6,251,700 B1 * | 6/2001 | Lin et al. | 438/70 |
| 6,306,676 B1 | 10/2001 | Stevens et al. | 438/48 |
| 6,376,871 B1 | 4/2002 | Arai | |
| 6,379,992 B2 * | 4/2002 | Jo | 438/70 |
| 6,465,859 B1 * | 10/2002 | Fujiwara et al. | 257/435 |

(Continued)

FOREIGN PATENT DOCUMENTS

CN    1444293 A    9/2003

(Continued)

OTHER PUBLICATIONS

An Office Action issued on Mar. 20, 2009, in corresponding Chinese Patent Application No. 2005100846497.

*Primary Examiner*—Ngoc-Yen T Vu
(74) *Attorney, Agent, or Firm*—Mills & Onello, LLP.

(57) ABSTRACT

A CMOS image sensor with improved sensitivity includes a main pixel array region of an active pixel array region formed on a semiconductor substrate. A passivation layer is formed over the sensor, and it is at least partially removed from the main pixel array region, such that incident light being detected by the main pixel array does not pass through the passivation layer. Optical absorption and refraction caused by the material of the passivation layer are eliminated, resulting in an image sensor with improved optical sensitivity.

45 Claims, 9 Drawing Sheets

U.S. PATENT DOCUMENTS

| | | | |
|---|---|---|---|
| 6,504,193 B1 | 1/2003 | Ishiwata et al. | |
| 6,507,365 B1 * | 1/2003 | Nakamura et al. | 348/296 |
| 6,566,151 B2 * | 5/2003 | Yeh et al. | 438/21 |
| 6,617,189 B1 * | 9/2003 | Chen et al. | 438/48 |
| 6,642,076 B1 | 11/2003 | Yaung et al. | |
| 6,660,553 B2 | 12/2003 | Kimura et al. | |
| 6,861,686 B2 * | 3/2005 | Lee et al. | 257/291 |
| 6,903,322 B2 * | 6/2005 | Nakashima | 250/208.1 |
| 6,995,411 B2 * | 2/2006 | Yaung et al. | 257/213 |
| 7,006,186 B2 * | 2/2006 | Chung | 349/141 |
| 7,372,497 B2 * | 5/2008 | Weng et al. | 348/340 |
| 2003/0173585 A1 * | 9/2003 | Kimura et al. | 257/197 |
| 2003/0197238 A1 | 10/2003 | Park | |
| 2006/0121640 A1 | 6/2006 | Kim | |
| 2007/0152286 A1 * | 7/2007 | Ahn | 257/414 |
| 2007/0278518 A1 | 12/2007 | Chen et al. | |

FOREIGN PATENT DOCUMENTS

| | | |
|---|---|---|
| JP | 2002-231915 | 8/2002 |
| KR | 2000-0006427 | 1/2000 |
| KR | 2000-41446 | 7/2000 |
| KR | 03-37870 | 5/2003 |
| KR | 2003-37870 | 5/2003 |
| KR | 03-58291 | 7/2003 |
| KR | 2003-58291 | 7/2003 |
| WO | 9306622 A1 | 4/1993 |

* cited by examiner

IMAGE SENSOR HAVING A PASSIVATION LAYER EXPOSING AT LEAST A MAIN PIXEL ARRAY REGION AND METHODS OF FABRICATING THE SAME

RELATED APPLICATION

This application relies for priority on Korean Patent Application number 04-55760, filed in the Korean Industrial Property Office on Jul. 16, 2004, the contents of which are incorporated herein in their entirety by reference.

FIELD OF THE INVENTION

The invention is related to image sensors, and, more particularly, to a CMOS image sensor having improved sensitivity.

BACKGROUND OF THE INVENTION

Image sensors are devices which receive an optical signal from an object and convert the optical signal to an electrical signal. The electrical signal can then be transmitted for further processing, such as digitization and then storage in a storage device such as a memory or optical or magnetic disk, or for presentation on a display, printing, etc. Image sensors are typically used in devices such as digital cameras, camcorders, printers, facsimile machines, etc.

Image sensors are typically of two types, namely, charge coupled device (CCD) sensors and CMOS image sensors (CIS). CCD sensors typically have advantages including low noise operation and device uniformity. CIS devices are typically characterized by low power consumption and can be operated at high speed due to a high frame rate capability.

Figure 1:
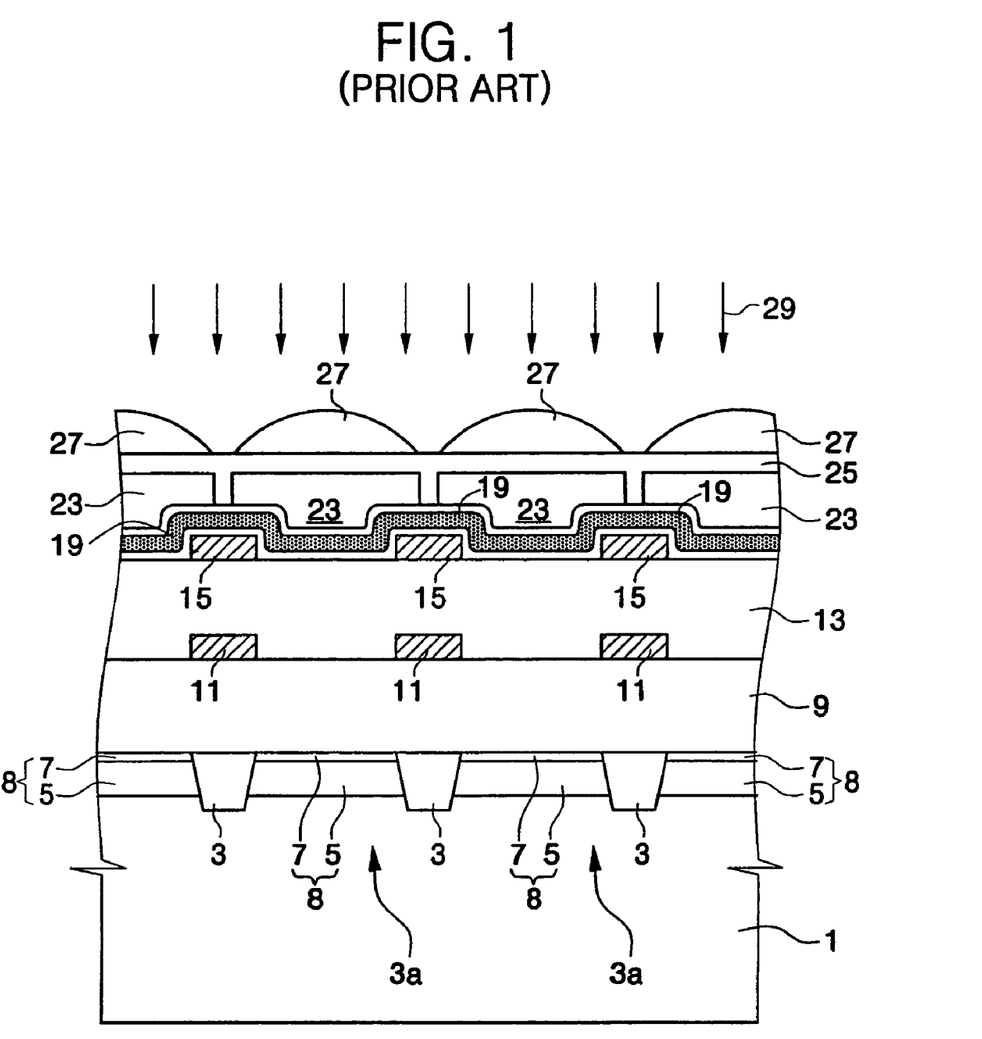
FIG. 1 contains a schematic partial cross-sectional view of an image sensor in accordance with the prior art.

FIG. 1 contains a schematic partial cross-sectional view of an image sensor in accordance with the prior art. The device of FIG. 1 includes a semiconductor substrate 1 on which are formed isolation regions 3, which define pixel active regions 3a therebetween. Multiple photosensing elements 8, which include n-type photodiodes 5 and p-type hole accumulated device (HAD) regions 7, are formed on the substrate 1 in the pixel active regions 3a. A first interlayer dielectric layer 9 is formed over the photosensing elements 8. A plurality of first interconnection lines 11 are formed over the first interlayer dielectric layer 9. A second interlayer dielectric layer 13 is formed over the first dielectric layer 9 and the first interconnection lines 11. A plurality of second interconnection lines 15 are formed on the second interlayer dielectric layer 13. A passivation layer 19 is formed on the second interconnection lines 15. Color filters 23 are formed as shown on the passivation layer 19 over the active pixel regions 3a, and a flattening layer 25 is formed over the color filters 23. Microlenses 27 are formed on the flattening layer 25 over the color filters 23.

The passivation layer 19 is used to prevent internal circuits from external environmental effects such as moisture. Silicon nitride (SiN) is usually used as a passivation layer. However, the SiN has a higher photon absorption rate and a higher refractive index than other commonly used dielectric films such as silicon dioxide ($SiO_2$). As a result, the amount of incident light 29 that reaches the photosensing elements 8 for detection by the sensor is reduced by absorption and refraction as the light passes through the passivation layer 19. As a result, the sensitivity of the sensor is reduced.

SUMMARY OF THE INVENTION

A feature of the present invention is to provide an image senor which has improved sensitivity over the sensors of the prior art.

Another feature of the invention is to provide a method of manufacturing an image sensor with improved sensitivity.

In accordance with a first aspect, the invention is directed to an image sensor. The image sensor of the invention includes a substrate on which are formed an active pixel array region, a pad region and a control circuit region. A main pixel array region is formed in the active pixel array region. A passivation layer is formed on the image sensor, the passivation layer being present in the control circuit region and being absent from the main pixel array region of the active pixel array region and from a bonding area of the pad region.

In one embodiment, the active pixel array region includes a dummy pixel array region. In one embodiment, the active pixel array region includes an optical black region.

The image sensor can be a CMOS image sensor.

In one embodiment, the passivation layer comprises silicon nitride.

The image sensor can also include a color filter formed in the active pixel array region. The image sensor can also include a microlens formed in the active pixel array region. The image sensor can also include a flattening layer formed in the active pixel array region.

In accordance with another aspect, the invention is directed to an image sensor. The image sensor includes a substrate on which are formed an active pixel array region, a pad region and a control circuit region. A main pixel array region is formed in the active pixel array region. A first passivation layer is formed on the image sensor, the first passivation layer being present in the control circuit region and being absent from the main pixel array region of the active pixel array region and from a bonding area of the pad region. A second passivation layer is formed over the first passivation layer.

In one embodiment, the active pixel array region includes a dummy pixel array region. In one embodiment, the active pixel array region includes an optical black region.

The image sensor can be a CMOS image sensor.

In one embodiment, the first and/or second passivation layers comprise silicon nitride.

The image sensor can also include a microlens formed in the active pixel array region. The image sensor can also include a flattening layer formed in the active pixel array region.

In one embodiment, the second passivation layer is absent from a bonding area of the pad region. In one embodiment, the second passivation layer is present in the control circuit region. In one embodiment, the second passivation layer is present in the main pixel array region of the active pixel array region.

In accordance with another aspect, the invention is directed to a method of making an image sensor, the method comprising: forming an active pixel array region, a pad region and a control circuit region on a substrate; forming a main pixel array region in the active pixel array region; and forming a passivation layer on the image sensor, the passivation layer being present in the control circuit region and being absent from the main pixel array region of the active pixel array region and from a bonding area of the pad region.

In one embodiment, the method of the invention further comprises forming a dummy pixel array region in the active pixel array region. In one embodiment, the method of the invention further comprises forming an optical black region in the active pixel array region.

In one embodiment, the image sensor is a CMOS image sensor. The passivation layer can comprise silicon nitride.

In one embodiment, the method of the invention further comprises forming a color filter in the active pixel array region. In one embodiment, the method of the invention further comprises forming a microlens in the active pixel array region. In one embodiment, the method of the invention further comprises forming a flattening layer in the active pixel array region.

In one embodiment, the main pixel array region is formed by a two-step ion implantation process including an n-type implantation and a p-type implantation.

In one embodiment, the method of the invention further comprises forming a transistor in the main pixel array region.

In one embodiment, the method of the invention further comprises: forming an interlayer dielectric layer; forming a conductive line; forming a passivation layer over the conductive line; etching the passivation layer using photolithography; forming a color filter over the passivation layer; and forming a microlens over the color filter. The method can also include: forming an n-type floating diffusion region; forming a second interlayer dielectric layer over the floating diffusion region; forming a first interconnection line over the second interlayer dielectric layer; forming a second interlayer dielectric layer over the first interlayer dielectric layer; forming an insulation layer; forming a first flattening layer under the color filter; forming a second flattening layer over the color filter; etching the first and second flattening layers to open the bonding area of the pad region; and forming a second passivation layer over the second flattening layer. The method can also include: etching the second passivation layer to open the bonding area of the pad region; etching the second flattening layer to open the bonding area of the pad region.

In another aspect, the invention is directed to a method of forming an image sensor, comprising: forming an active pixel array region, a pad region and a control circuit region on a substrate; forming a main pixel array region in the active pixel array region; forming a first passivation layer on the image sensor, the first passivation layer being present in the control circuit region and being absent from the main pixel array region of the active pixel array region and from a bonding area of the pad region; and forming a second passivation layer over the first passivation layer.

In one embodiment, the method of the invention further comprises forming a dummy pixel array region in the active pixel array region. In one embodiment, the method of the invention further comprises forming an optical black region in the active pixel array region.

In one embodiment, the method of the invention further comprises the image sensor is a CMOS image sensor. The first and/or second passivation layers can include silicon nitride. In one embodiment, the method of the invention further comprises forming a microlens in the active pixel array region. In one embodiment, forming a flattening layer in the active pixel array region.

In one embodiment, the second passivation layer is absent from a bonding area of the pad region. In one embodiment, the second passivation layer is present in the control circuit region. In one embodiment, the second passivation layer is present in the main pixel array region of the active pixel array region.

In accordance with the invention, by eliminating the passivation layer from the main pixel array region of the active pixel array region, the passivation layer does not interfere with incident light being detected by the sensor of the invention. That is, the absorption and refraction effects of the prior art, which tended to reduce the sensitivity of sensors of the prior art, are eliminated in the present invention. As a result, a more sensitive image sensor is obtained.

BRIEF DESCRIPTION OF THE DRAWINGS

The foregoing and other features and advantages of the invention will be apparent from the more particular description of an embodiment of the invention, as illustrated in the accompanying drawing. The drawing is not necessarily to scale, emphasis instead being placed upon illustrating the principles of the invention. Like reference characters refer to like elements throughout the drawings.

DETAILED DESCRIPTION OF PREFERRED EMBODIMENTS OF THE INVENTION

Figure 2:
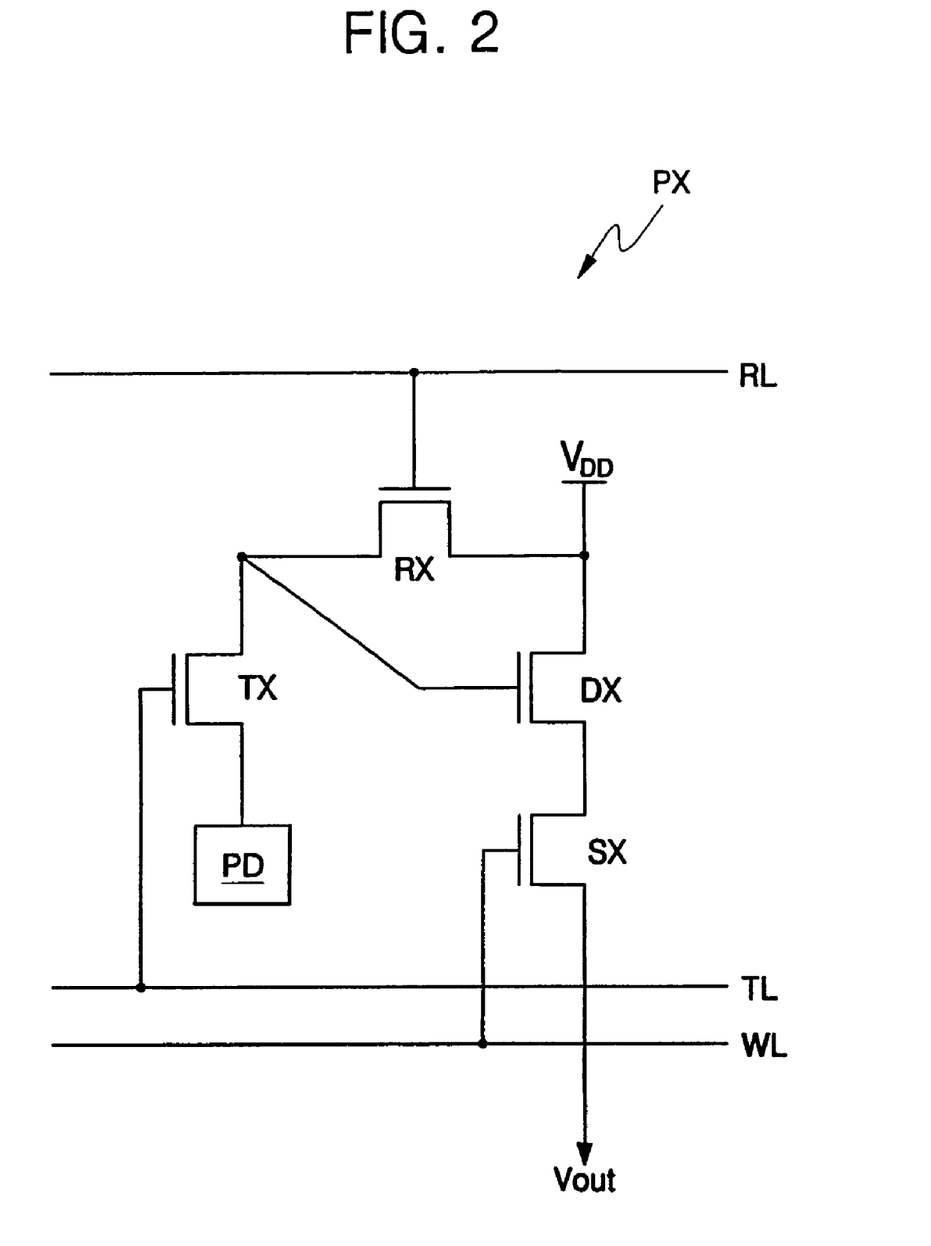
FIG. 2 contains a schematic diagram of an active pixel in accordance with the invention.

FIG. 2 contains a schematic diagram of an active pixel PX in accordance with the invention. The active pixel PX includes a photodiode PD for capturing incident light and converting it into an electrical signal, i.e., an amount of charge. A transfer transistor TX receives the charge from the photodiode PD and passes the charge from the photodiode PD to a floating diffusion region of the pixel sensor circuit. A reset transistor RX is used to reset any charge that accumulates in the floating diffusion region to a reference level. A driver transistor DX is connected in a source follower configuration to buffer the output voltage Vout. A select transistor SX is used in selecting the pixel circuit.

The gate electrode of the transfer transistor TX is electrically connected to a transfer line TL of the circuit. The gate electrode of the reset transistor RX is electrically connected to a reset line RL. The gate electrode of the select transistor SX electrically connected to a word line WL.

Figure 3:
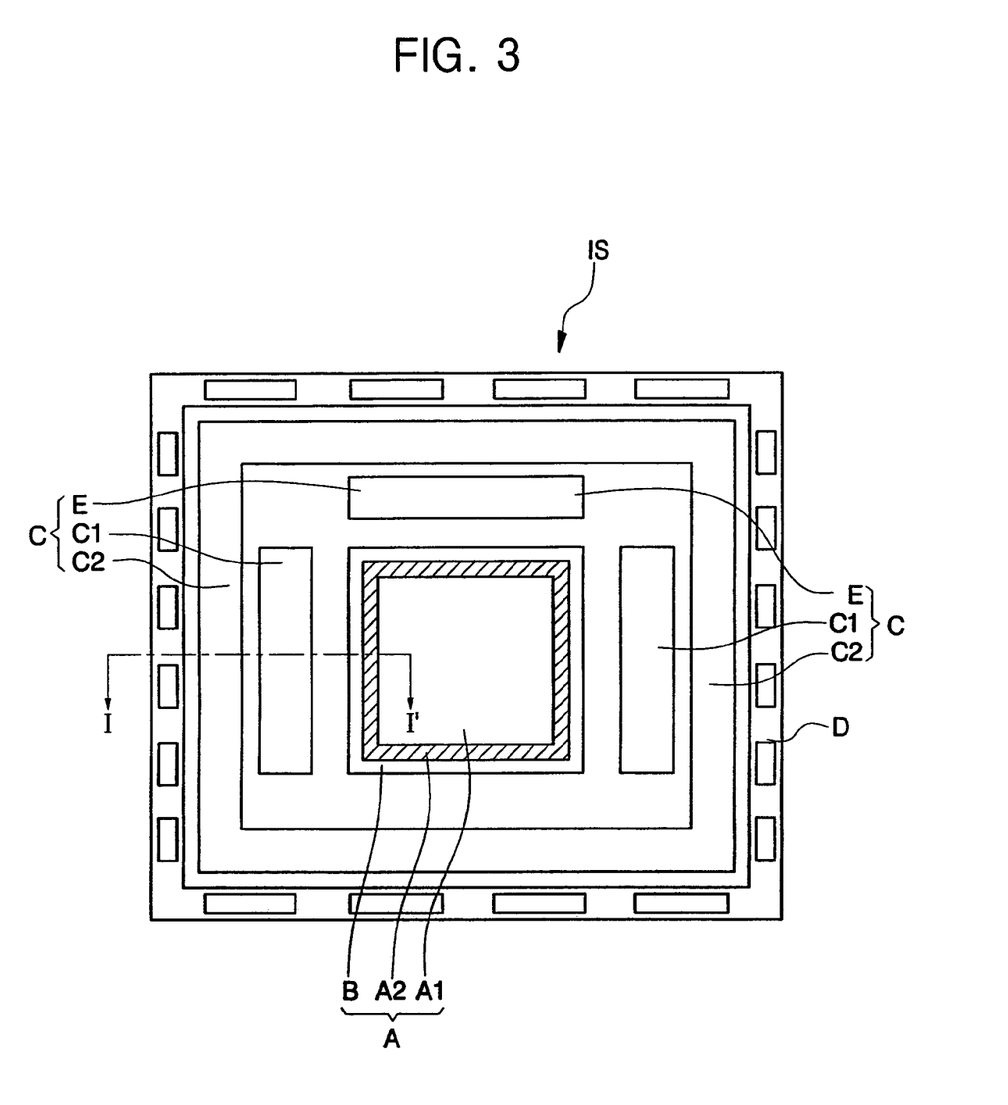
FIG. 3 is a schematic top plan view of a CMOS image sensor in accordance with the invention.

FIG. 3 is a schematic top plan view of a CMOS image sensor IS in accordance with the invention. The image sensor IS includes an active pixel array region A having a main pixel array region A1, an optional dummy pixel array region A2 and an optional optical black region B. The image sensor IS also includes a control circuit region C, which can include a row driver C1, a column driver E and other circuits C2, which can include such circuits as a correlated double sampler (CDS), an analog-to-digital converter (ADC), a digital signal processor (DSP) and other circuits used in connection with the operation of the image sensor IS. The image sensor IS also includes a pad region D at which electrical connections such as wires and conductive lines can be bonded to the image sensor IS.

Figure 4:
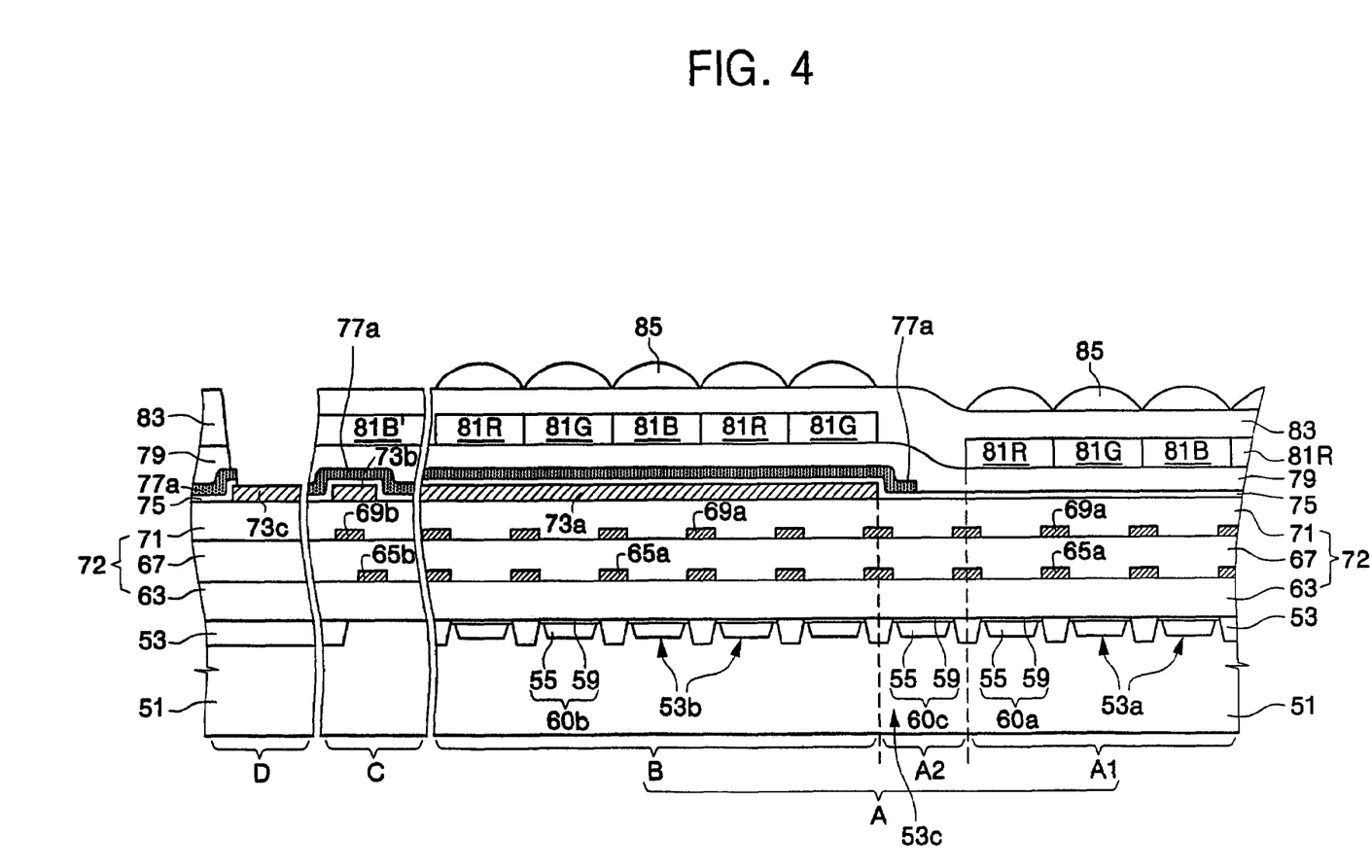
FIG. 4 is a schematic partial cross-sectional view of one embodiment of the image sensor IS of FIG. 3, taken along line I-I' of FIG. 3.

FIG. 4 is a schematic partial cross-sectional view of one embodiment of the image sensor IS of FIG. 3, taken along line I-I' of FIG. 3. Referring to FIG. 4, the sensor is shown to include the active pixel array region A, which includes the main pixel array region A1, the dummy pixel array region A2 and the optical black region B. Also shown are the control circuit region C and the pad region D.

The sensor of FIG. 4 is formed on a semiconductor substrate 51. Isolation regions 53 are formed in the substrate 51 to define the main pixel active region 53*i* a, the reference pixel (optical black) active region 53*b* and the dummy pixel active region 53*c*. Photosensing regions 60*a*, 60*b* and 60*c* are defined in the active regions of the main pixel array region A1, the optical black region B and the dummy pixel array region A2, respectively. Each of the photosensing regions 60*a*, 60*b* and 60*c* includes an n-type photodiode 55 and a p-type HAD region 59.

An interlayer dielectric layer 72 is formed over the substrate 51 and the photosensing regions. In the embodiment illustrated in FIG. 4, the interlayer dielectric layer 72 includes a first interlayer dielectric layer 63, a second interlayer dielectric layer 67 over the first interlayer dielectric layer 63 and a third interlayer dielectric layer 71 over the second interlayer dielectric layer 67. A first interconnection line 65 is formed over the first interlayer dielectric layer 63, and the second interlayer dielectric layer 67 is formed over the first interconnection line 65. A second interconnection line 69 is formed over the second interlayer dielectric layer 67, and the third interlayer dielectric layer 71 is formed over the second interconnection line 69. The second interconnection line 69 includes a first portion 69*a* in the active pixel array region A and a second portion 69*b* in the control circuit region C.

A layer 73 made of, for example, conductive aluminum, is formed over the third interlayer dielectric layer 71. The layer 73 includes a light blocking layer 73*a* formed in the optical black region B, a power supply line portion 73*b* formed in the control circuit region C and a bonding pad portion 73*c* formed in the pad region D. The portion 73*c* of the conductive layer 73 is in the pad bonding area of the pad region D. An insulation layer made of, for example, silicon oxide, is formed over the third interlayer dielectric layer 71 and the conductive layer 73, including the light blocking portion 73*a* and the supply line portion 73*b*. The insulation layer is not present on the pad bonding portion 73*c* of the conductive layer 73.

A passivation layer 77*a* made of, for example, silicon nitride (SiN), is formed over the insulation layer 75. The passivation layer 77*a* is not present over the main pixel array region A1 of the active pixel array region A. The passivation layer is partially present in the dummy pixel array region A2 of the active pixel array region A. The passivation layer 77*a* is present in the optical black region B and in the control circuit region C. The passivation layer 77*a* is partially present in the pad region D in that it is not present in the actual bonding area of the pad region D.

A flattening layer 79 is formed over the passivation layer 77*a* and over the insulation layer 75 in the main pixel array region A1 of the active pixel array region A. Color filters labeled 81R, 81G, 81B and 81B' are formed over the main pixel array region A1, the optical black region B and the control circuit region C. A second flattening layer 83 is formed over the color filters, except in the boding area of the pad region D. Microlenses 85 are formed over the second flattening layer 83 in the main pixel array region A1 and the optical black region B of the active pixel array region A.

Hence, in accordance with the invention, it is known that the microlenses 85 and the color filters protect the main pixel array region A1 from external environmental effects such as moisture. Therefore, the passivation layer 77*a* is not used in the main pixel array region A1. Therefore, incident light being detected in the main pixel array region A1 need not pass through the passivation layer 77*a*. As a result, the absorption and refraction in devices of the prior art caused by the passivation layer are eliminated, and a sensor with higher sensitivity is realized.

It is noted that in the embodiment of the invention illustrated in FIG. 4, the passivation layer 77*a* is not present in the main pixel array region A1 of the active pixel array region A. The passivation layer 77*a* may or may not be present in the optical black region B. It may or may not be present in the dummy pixel array region A2. It is present in the control circuit region C, and it is partially present in the pad region D, in that it is not present in the actual pad bonding area of the pad region D.

Figure 5:
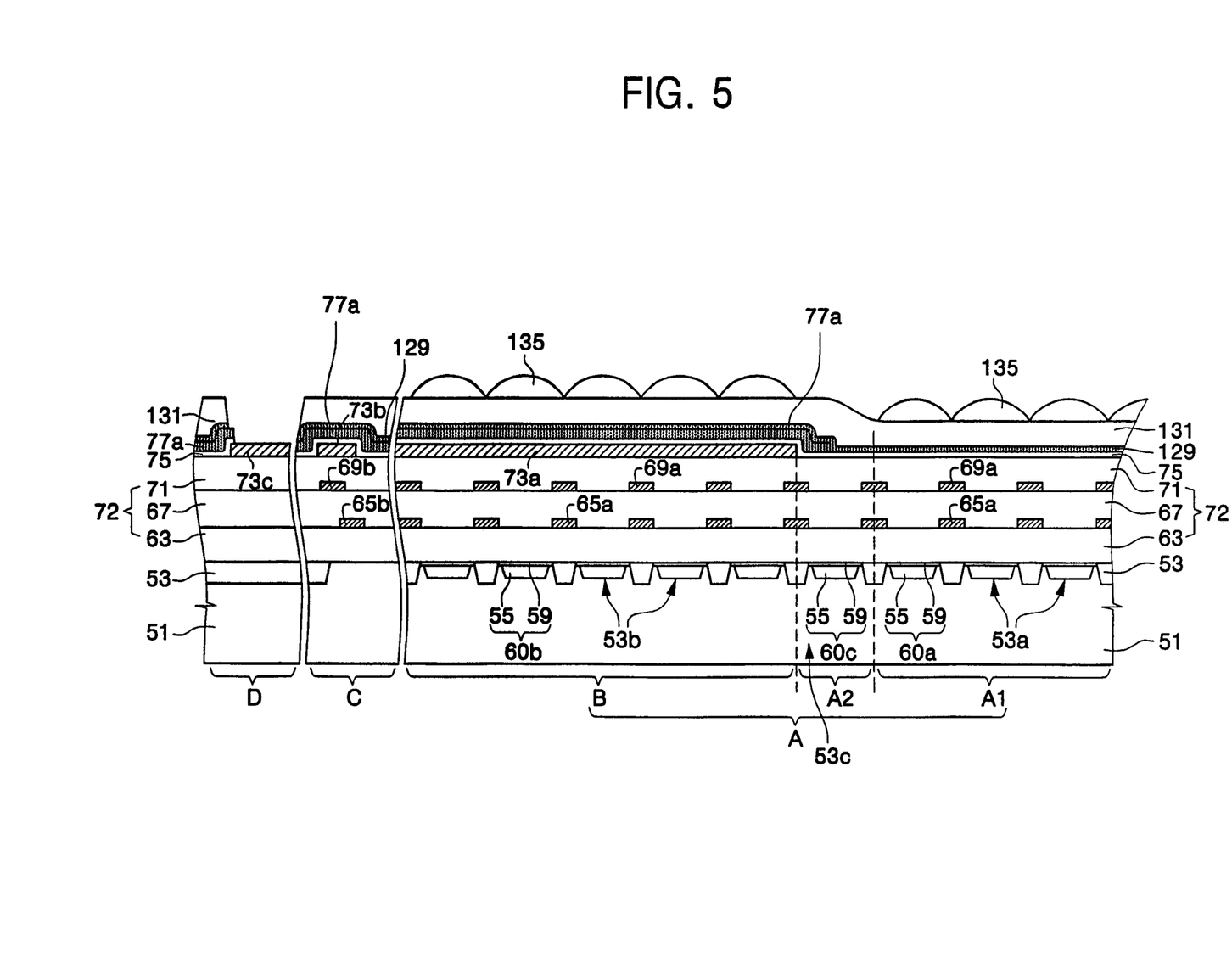
FIG. 5 is a schematic partial cross-sectional view of another embodiment of the image sensor IS of FIG. 3, taken along line I-I' of FIG. 3.

FIG. 5 is a schematic partial cross-sectional view of another embodiment of the image sensor IS of FIG. 3, taken along line I-I' of FIG. 3. The sensor of FIG. 5 is a black-white sensor. Therefore, it does not include the color filters of the embodiment of FIG. 4. Since the color filters are not present, the protection they provide from external environmental effects such as moisture are also not present. Accordingly, to protect the sensor of FIG. 5 from moisture and other effects, a second passivation layer is added after the passivation layer of the sensor of FIG. 3 is formed. The second passivation layer is allowed to remain in the main pixel array region A1 of the active pixel array region A to protect the main pixel array region A1 from external environmental effects.

The image sensor of FIG. 5 is very similar to that of FIG. 4, with the exception of the lack of color filters and the presence of the second passivation layer. Specifically, the sensor of FIG. 5 is the same as the sensor of FIG. 4 up to the silicon oxide insulation layer 75. Accordingly, description of the like features of the two sensors will not be repeated here.

Referring to FIG. 5, the first passivation layer 77*a* made of, for example, silicon nitride (SiN), is formed over the insulation layer 75. The first passivation layer 77*a* is not present over the main pixel array region A1 of the active pixel array region A. The first passivation layer 77*a* is partially present in the dummy pixel array region A2 of the active pixel array region A. The first passivation layer 77*a* is present in the optical black region B and in the control circuit region C. The first passivation layer 77*a* is partially present in the pad region D in that it is not present in the actual bonding area of the pad region D.

The second passivation layer 129 made of, for example, silicon nitride, is formed over the insulation layer 75 in the main pixel array region A1 over the insulation layer 75 and the first passivation layer 77*a* in the dummy pixel array region A2, over the first passivation layer 77*a* in the optical black region B, the control circuit region C and the pad region D. The second passivation layer 129 is not present in the bonding area of the pad region D. In one embodiment, the first passivation layer 77a is five times the thickness of the second passivation layer 129. For example, in one particular embodiment, the first passivation layer is 1000 Å thick, and the second passivation layer 129 is 200 Å thick.

A flattening layer 131 is formed over the second passivation layer 129 and over the insulation layer 75 in the main pixel array region A1 of the active pixel array region A. Microlenses 135 can optionally be formed over the second flattening layer 135 in the main pixel array region A1 and the optical black region B of the active pixel array region A.

As noted above, in the sensor of FIG. 5, the second passivation layer 129 provides protection from external environmental effects such as moisture in the main pixel array region where no color filters, which would have provided protection as in the embodiment of FIG. 4, are present. Because the second passivation layer 129 is relatively thin, the optical absorption and refraction effects are minimized, resulting again in a sensor with improved sensitivity.

In the embodiment of the image sensor of FIG. 5, the first passivation layer 77a is not present in the main pixel array region A1. It is present in the control circuit region C, and it is partially present in the pad region D, in that it is not present in the pad bonding area of the pad region D. The first passivation layer 77a may or may not be present in the dummy pixel array region A2 and in the optical black region B. The second passivation layer 129 is present in the main pixel array region A1 and is partially present in the pad region D. The second passivation layer 129 is optionally present in the control circuit region C, the dummy pixel array region A2 and the optical black region B. Typically, in these latter three regions, the second passivation layer 129 will be allowed to remain if there are no subsequent photolithography fabrication steps that would allow for the second passivation layer 129 to be removed. That is, since the second passivation layer 129 is optional, it may be desirable from a fabrication time and cost standpoint that a special step to remove the layer 129 from these regions not be included.

Figure 6:
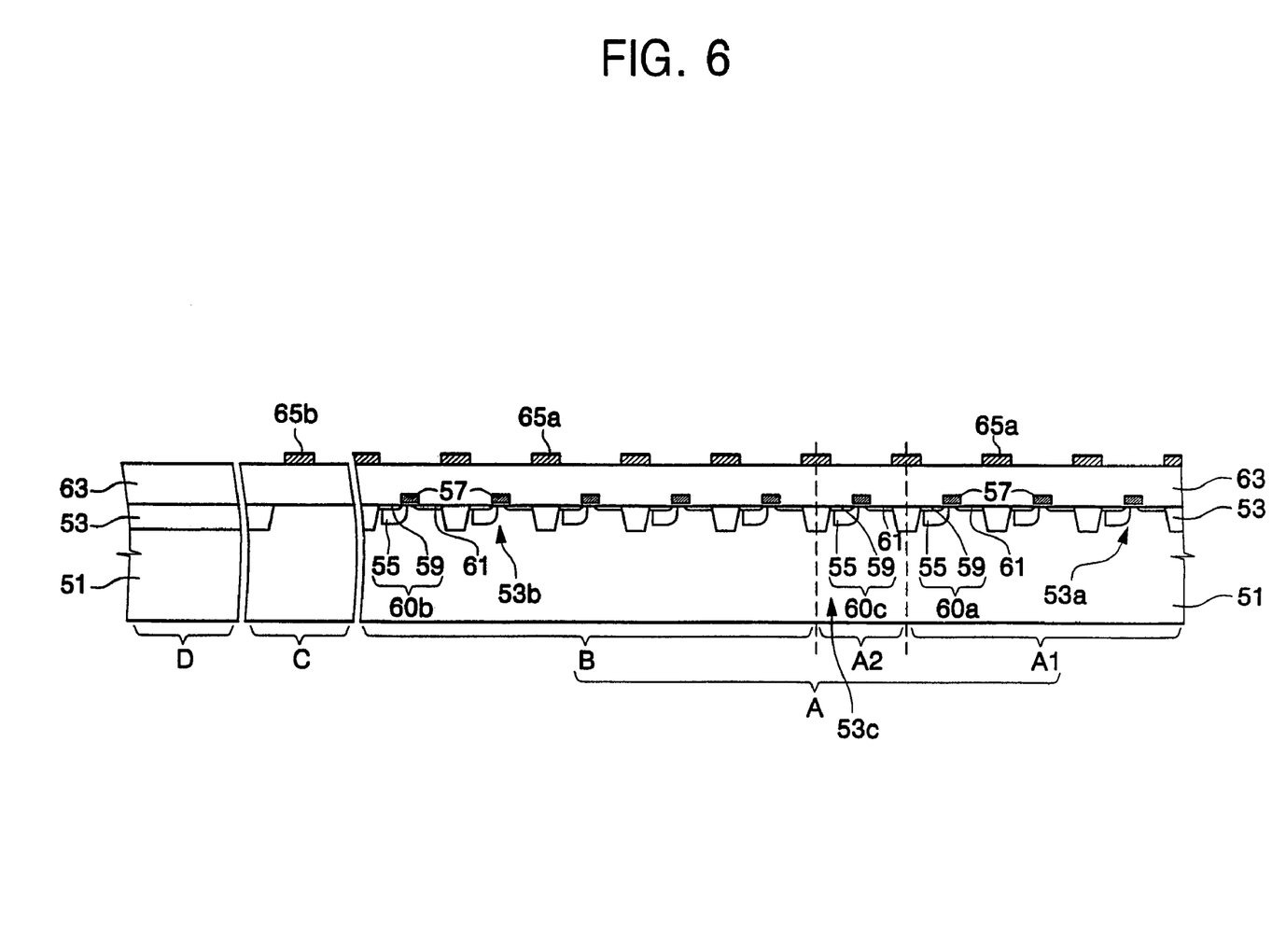
FIG. 6 contains a schematic cross-sectional view of steps in one embodiment of a method of making an image sensor according to the invention, taken along line I-I' of FIG. 3.

FIG. 6 contains a schematic cross-sectional view of steps in one embodiment of a method of making an image sensor according to the invention, taken along line I-I' of FIG. 3. Referring to FIG. 6, a semiconductor substrate 51 is prepared, and isolation regions 53 are formed in the substrate 51 to define the main pixel active region 53a, the reference pixel (optical black) active region 53b and the dummy pixel active region 53c. Photosensing regions 60a, 60b and 60c are defined in the active regions of the main pixel array region A1, the optical black region B and the dummy pixel array region A2, respectively. Each of the photosensing regions 60a, 60b and 60c is formed by forming an n-type photodiode 55 and a p-type HAD region 59. The sensing regions can be formed by a two-step ion implantation process, which includes an n-type implantation to form the n-type photodiode 55 and a p-type implantation to form the p-type HAD region 59.

Transistors can be formed on the structure by forming transistor gate structures on the surface as shown, and by forming n-type floating diffusion regions 61. A first interlayer dielectric layer 63 is formed over the structure, and the first interconnection line 65 is formed on the first interlayer dielectric layer 63.

Figure 7:
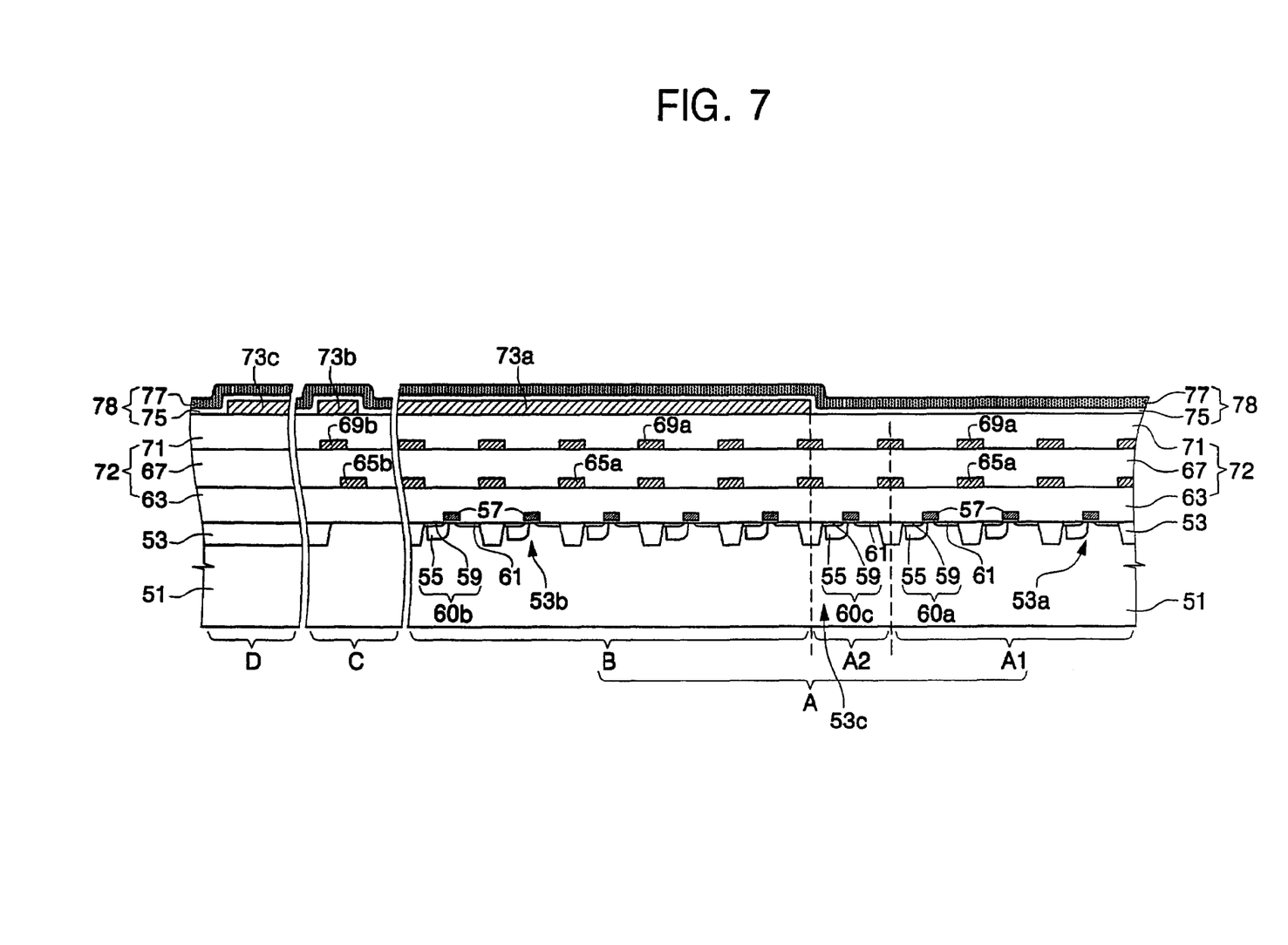
FIG. 7 contains a schematic cross-sectional view of additional steps in one embodiment of a method of making an image sensor according to the invention, taken along line I-I' of FIG. 3.

FIG. 7 contains a schematic cross-sectional view of additional steps in the method of making an image sensor shown in FIGS. 4 and 6. Referring to FIG. 7, an interlayer dielectric layer 72 is formed over the substrate 51 and the photosensing regions. The interlayer dielectric layer 72 is formed by forming the first interlayer dielectric layer 63, forming a second interlayer dielectric layer 67 over the first interlayer dielectric layer 63 and forming a third interlayer dielectric layer 71 over the second interlayer dielectric layer 67. The first interconnection line 65 is formed over the first interlayer dielectric layer 63, and the second interlayer dielectric layer 67 is formed over the first interconnection line 65. A second interconnection line 69 is formed over the second interlayer dielectric layer 67, and the third interlayer dielectric layer 71 is formed over the second interconnection line 69. The second interconnection line 69 includes a first portion 69a in the active pixel array region A and a second portion 69b in the control circuit region C.

A conductive line or layer 73 made of, for example, conductive aluminum, is formed over the third interlayer dielectric layer 71. The layer 73 includes a light blocking layer 73a formed in the optical black region B, a power supply line portion 73b formed in the control circuit region C and a bonding pad portion 73c formed in the pad region D. The portion 73c of the conductive layer 73 is in the pad bonding area of the pad region D. An insulation layer made of, for example, silicon oxide, is formed over the third interlayer dielectric layer 71 and the conductive layer 73, including the light blocking portion 73a and the supply line portion 73b. The insulation layer is not present on the pad bonding portion 73c of the conductive layer 73. A passivation layer 77a made of, for example, silicon nitride (SiN), is formed over the insulation layer 75.

Figure 8:
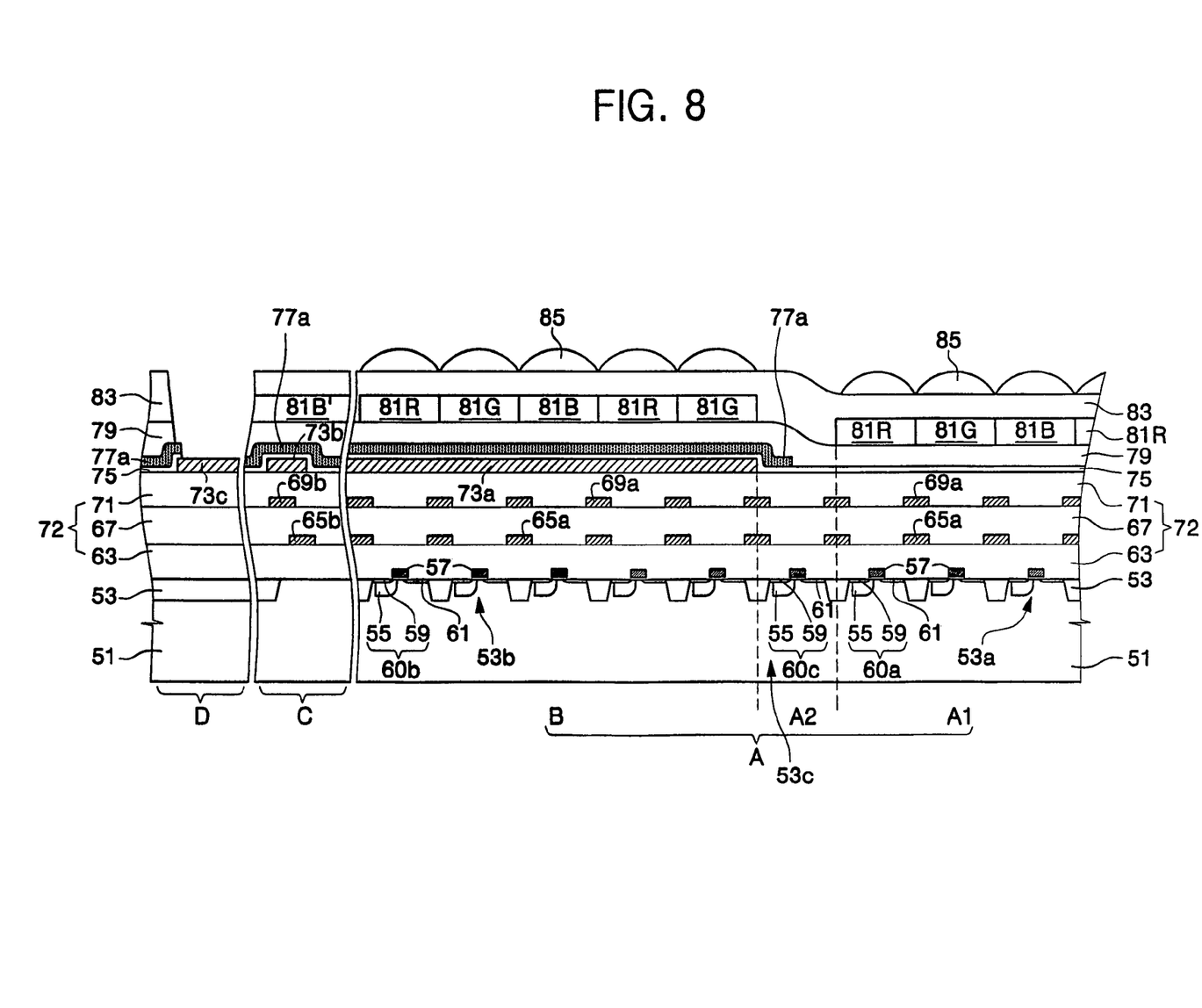
FIG. 8 contains a schematic cross-sectional view of additional steps in one embodiment of a method of making an image sensor according to the invention, taken along line I-I' of FIG. 3.

FIG. 8 contains a schematic cross-sectional view of additional steps in the method of making an image sensor shown in FIGS. 4, 6 and 7. Referring to FIG. 8, the passivation layer 77a is etched such that it is removed from the main pixel array region A1 and from a portion of the dummy pixel array region A2 and from the bonding area of the pad region D. That is, after the etching of the passivation layer 77a, the passivation layer 77a is not present over the main pixel array region A1 of the active pixel array region A. The passivation layer is partially present in the dummy pixel array region A2 of the active pixel array region A. The passivation layer 77a is present in the optical black region B and in the control circuit region C. The passivation layer 77a is partially present in the pad region D in that it is not present in the actual bonding area of the pad region D.

A flattening layer 79 is formed over the passivation layer 77a and over the insulation layer 75 in the main pixel array region A1 of the active pixel array region A. Color filters labeled 81R, 81G, 81B and 81B' are formed over the main pixel array region A1, the optical black region B and the control circuit region C. A second flattening layer 83 is formed over the color filters, except in the boding area of the pad region D. Microlenses 85 are formed over the second flattening layer 83 in the main pixel array region A1 and the optical black region B of the active pixel array region A.

Figure 9:
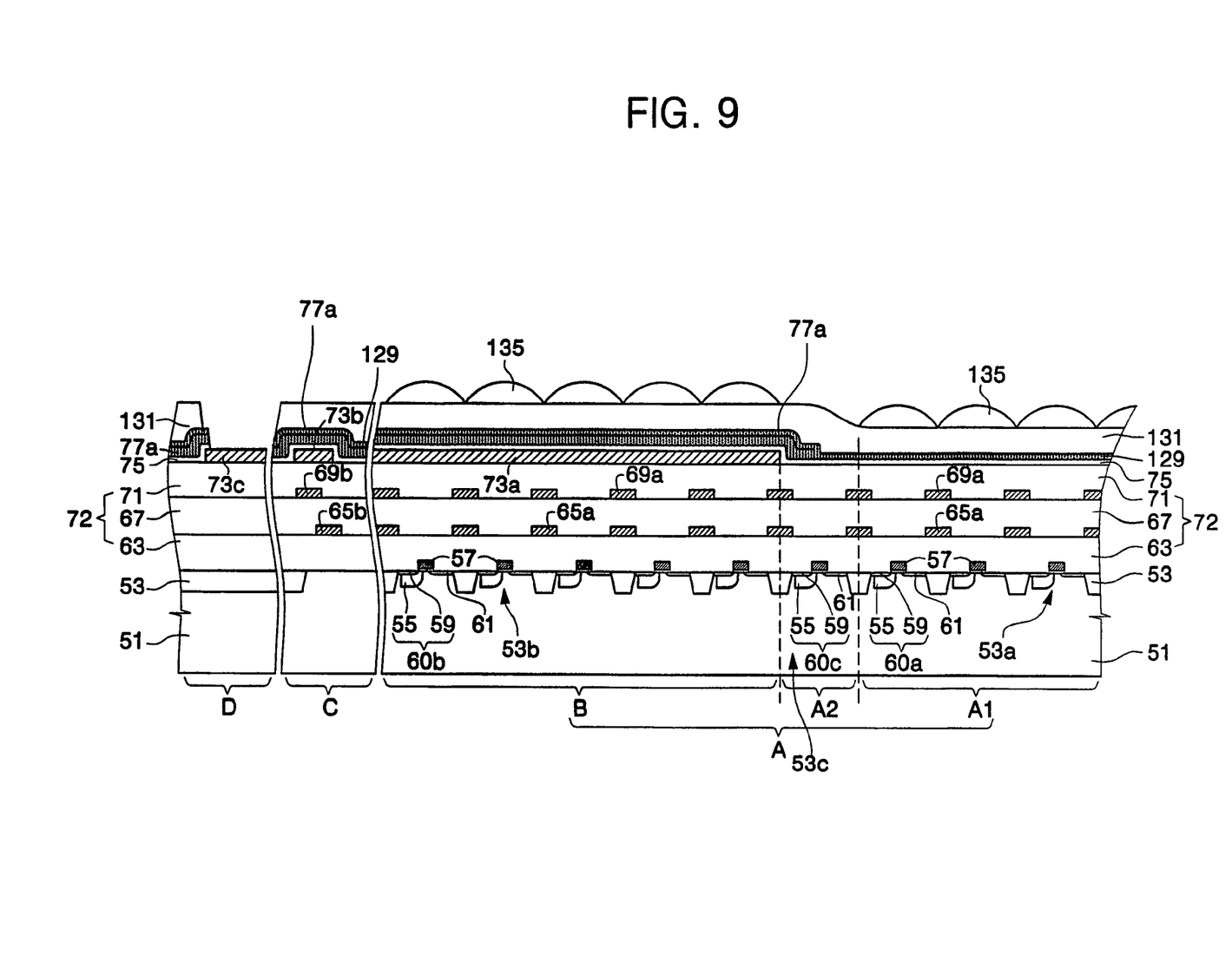
FIG. 9 contains a schematic cross-sectional view of additional steps in another embodiment of a method of making an image sensor according to the invention, taken along line I-I' of FIG. 3.

FIG. 9 contains a schematic cross-sectional view of steps in another embodiment of a method of making an image sensor according to the invention, taken along line I-I' of FIG. 3. Specifically, FIG. 9 illustrates the steps used in making the sensor of FIG. 5 that are different from the steps illustrated in FIGS. 6 through 8 for the sensor of FIG. 4. The steps used in making the sensor of FIG. 5 are the same as those for the sensor of FIG. 4 up to formation of the first passivation layer 77a. Therefore, description of the like steps will not be repeated.

Referring to FIG. 9, the second passivation layer 129 made of, for example, silicon nitride having a thickness of 50 to 400 Å, is formed over the insulation layer 75. The second passivation layer 129 is etched to open the pad bonding area of the pad region D. That is, the second passivation layer is etched such that it is not present in the bonding area of the pad region D. In one embodiment, the first passivation layer 77a is five times the thickness of the second passivation layer 129. For example, in one particular embodiment, the first passivation layer 77a is 1000 Å thick, and the second passivation layer 129 is 200 Å thick.

A flattening layer 131 is formed over the second passivation layer 129 and is etched to open the bonding area of the pad region D. Microlenses 135 can optionally be formed over the second flattening layer 131 in the main pixel array region A1 and the optical black region B of the active pixel array region A. It should be noted that as an alternative to the embodiment described above in which the fist and second passivation layers and the flattening layer are all formed and etched separately to open the bonding pad window, the three layers can be formed, and then all three layers can be etched at once to open the bonding pad window.

While the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. An image sensor, comprising:
   a substrate on which are formed an active pixel array region, a pad region and a control circuit region;
   a main pixel array region formed in the active pixel array region, wherein the main pixel array region includes an isolation region in the substrate and main pixel active regions having photosensing regions therein and defined by the isolation region in the substrate; and
   a passivation layer formed on the image sensor, the passivation layer being present in the control circuit region and being absent from the main pixel array region of the active pixel array region and from a bonding area of the pad region.

2. The image sensor of claim 1, wherein the active pixel array region includes a dummy pixel array region.

3. The image sensor of claim 1, wherein the active pixel array region includes an optical black region.

4. The image sensor of claim 1, wherein the image sensor is a CMOS image sensor.

5. The image sensor of claim 1, wherein the passivation layer comprises silicon nitride.

6. The image sensor of claim 1, further comprising a color filter formed in the active pixel array region.

7. The image sensor of claim 1, further comprising a microlens formed in the active pixel array region.

8. The image sensor of claim 1, further comprising a flattening layer formed in the active pixel array region.

9. The image sensor of claim 1, wherein the passivation layer is present in the control circuit region and a portion of the pad region, and is absent from the main pixel array region of the active pixel array region and from the bonding area of the pad region.

10. The image sensor of claim 1, further comprising:
    an interlayer dielectric layer below the passivation layer; and
    a conductive line over the interlayer dielectric layer, the line including a power line covering a portion of the control circuit region, a bonding pad covering a portion of the pad region, and an optical black layer covering an optical black region in the active pixel array region, thereby exposing the interlayer dielectric layer in the main pixel array region.

11. An image sensor, comprising:
    a substrate on which are formed an active pixel array region, a pad region and a control circuit region;
    a main pixel array region formed in the active pixel array region, wherein the main pixel array region includes an isolation region in the substrate and main pixel active regions having photosensing regions therein and defined by the isolation region in the substrate;
    a first passivation layer formed on the image sensor, the first passivation layer being present in the control circuit region and being absent from the main pixel array region of the active pixel array region and from a bonding area of the pad region; and
    a second passivation layer formed over the first passivation layer and in the main pixel array region.

12. The image sensor of claim 11, wherein the active pixel array region includes a dummy pixel array region.

13. The image sensor of claim 11, wherein the active pixel array region includes an optical black region.

14. The image sensor of claim 11, wherein the image sensor is a CMOS image sensor.

15. The image sensor of claim 11, wherein the first passivation layer comprises silicon nitride.

16. The image sensor of claim 11, wherein the second passivation layer comprises silicon nitride.

17. The image sensor of claim 11, further comprising a microlens formed in the active pixel array region.

18. The image sensor of claim 11, further comprising a flattening layer formed in the active pixel array region.

19. The image sensor of claim 11, wherein the second passivation layer is absent from a bonding area of the pad region.

20. The image sensor of claim 11, wherein the second passivation layer is present in the control circuit region.

21. The image sensor of claim 11, wherein at least one of the first and second passivation layers is present in the control circuit region and a portion of the pad region, and is absent from the main pixel array region of the active pixel array region and from the bonding area of the pad region.

22. The image sensor of claim 11, further comprising:
    an interlayer dielectric layer below the passivation layer; and
    a conductive line over the interlayer dielectric layer, the line including a power line covering a portion of the control circuit region, a bonding pad covering a portion of the pad region, and an optical black layer covering an optical black region in the active pixel array region, thereby exposing the interlayer dielectric layer in the main pixel array region.

23. A method of making an image sensor, comprising:
    forming an active pixel array region, a pad region and a control circuit region on a substrate;
    forming a main pixel array region in the active pixel array region, wherein the main pixel array region includes an isolation region in the substrate and main pixel active regions having photosensing regions therein and defined by the isolation region in the substrate; and
    forming a passivation layer on the image sensor, the passivation layer being present in the control circuit region and being absent from the main pixel array region of the active pixel array region and from a bonding area of the pad region.

24. The method of claim 23, further comprising forming a dummy pixel array region in the active pixel array region.

25. The method of claim 23, further comprising forming an optical black region in the active pixel array region.

26. The method of claim 23, wherein the image sensor is a CMOS image sensor.

27. The method of claim 23, wherein the passivation layer comprises silicon nitride.

28. The method of claim 23, further comprising forming a color filter in the active pixel array region.

29. The method of claim 23, further comprising forming a microlens in the active pixel array region.

30. The method of claim 23, further comprising forming a flattening layer in the active pixel array region.

31. The method of claim 23, wherein the main pixel array region is formed by a two-step ion implantation process including an n-type implantation and a p-type implantation.

32. The method of claim 23, further comprising forming a transistor in the main pixel array region.

33. The method of claim 23, further comprising:
  forming an interlayer dielectric layer prior to formation of the passivation layer;
  forming a conductive line over the interlayer dielectric layer, the line being formed to include a power line covering a portion of the control circuit region, a bonding pad covering a portion of the pad region and an optical black layer covering an optical black region in the active pixel array region, thereby exposing the interlayer dielectric layer in the main pixel array region;
  forming a color filter over the interlayer dielectric layer in the main pixel array region after formation of the passivation layer; and
  forming a microlens over the color filter.

34. The method of claim 33, further comprising:
  forming a photo sensing element in the substrate prior to formation of the interlayer dielectric layer;
  forming an insulation layer over the interlayer dielectric layer;
  forming a first flattening layer over the insulation layer and the passivation layer prior to formation of the color filter;
  forming a second flattening layer over the color filter and the first flattening layer after formation of the color filter; and
  etching the first and second flattening layers to open the bonding pad of the pad region.

35. A method of forming an image sensor, comprising:
  forming an active pixel array region, a pad region and a control circuit region on a substrate;
  forming a main pixel array region in the active pixel array region, wherein the main pixel array region includes an isolation region in the substrate and main pixel active regions having photosensing regions therein and defined by the isolation region in the substrate;
  forming a first passivation layer on the image sensor, the first passivation layer being present in the control circuit region and being absent from the main pixel array region of the active pixel array region and from a bonding area of the pad region; and
  forming a second passivation layer over the first passivation layer and in the main pixel array region.

36. The method of claim 35, further comprising forming a dummy pixel array region in the active pixel array region.

37. The method of claim 35, further comprising forming an optical black region in the active pixel array region.

38. The method of claim 35, wherein the image sensor is a CMOS image sensor.

39. The method of claim 35, wherein the first passivation layer comprises silicon nitride.

40. The method of claim 35, wherein the second passivation layer comprises silicon nitride.

41. The method of claim 35, further comprising forming a microlens over the second passivation layer in the active pixel array region.

42. The method of claim 41, further comprising forming a flattening layer on the second passivation layer prior to formation of the microlens.

43. The method of claim 35, wherein the second passivation layer is absent from the bonding area of the pad region.

44. The method of claim 35, wherein the second passivation layer is present in the control circuit region.

45. A method of making an image sensor, comprising:
  forming an active pixel array region, a pad region and a control circuit region on a substrate;
  forming a main pixel array region in the active pixel array region;
  forming a passivation layer on the image sensor, the passivation layer being present in the control circuit region and being absent from the main pixel array region of the active pixel array region and from a bonding area of the pad region;
  forming an interlayer dielectric layer prior to formation of the passivation layer;
  forming a conductive line over the interlayer dielectric layer, the line being formed to include a power line covering a portion of the control circuit region, a bonding pad covering a portion of the pad region and an optical black layer covering an optical black region in the active pixel array region, thereby exposing the interlayer dielectric layer in the main pixel array region;
  forming a color filter over the interlayer dielectric layer in the main pixel array region after formation of the passivation layer; and
  forming a microlens over the color filter.

* * * * *